United States Patent
Yu et al.

(10) Patent No.: US 10,822,523 B2
(45) Date of Patent: *Nov. 3, 2020

(54) COMPOSITION FOR ORGANIC ELECTRONIC ELEMENT ENCAPSULANT, AND ENCAPSULANT FORMED USING SAME

(71) Applicant: Momentive Performance Materials Korea Co., Ltd., Seoul (KR)

(72) Inventors: Sun Yu, Seoul (KR); Nan Soo Kim, Seoul (KR); Minjae Jeong, Seoul (KR); Sunaga Takeshi, Gunma (JP)

(73) Assignee: Momentive Performance Materials Korea Co., Ltd., Seoul (KR)

( * ) Notice: Subject to any disclaimer, the term of this patent is extended or adjusted under 35 U.S.C. 154(b) by 15 days.

This patent is subject to a terminal disclaimer.

(21) Appl. No.: 16/330,267

(22) PCT Filed: Sep. 26, 2017

(86) PCT No.: PCT/KR2017/010602
§ 371 (c)(1),
(2) Date: Mar. 4, 2019

(87) PCT Pub. No.: WO2018/062807
PCT Pub. Date: Apr. 5, 2018

(65) Prior Publication Data
US 2019/0194492 A1    Jun. 27, 2019

(30) Foreign Application Priority Data

Sep. 28, 2016    (KR) .......................... 10-2016-0124797

(51) Int. Cl.
| | | |
|---|---|---|
| C08L 83/04 | (2006.01) | |
| C09D 183/10 | (2006.01) | |
| H01L 51/52 | (2006.01) | |
| C09D 183/06 | (2006.01) | |
| C09D 183/04 | (2006.01) | |
| C08G 77/20 | (2006.01) | |
| C08F 230/08 | (2006.01) | |

(52) U.S. Cl.
CPC ............ *C09D 183/10* (2013.01); *C08L 83/04* (2013.01); *C09D 183/04* (2013.01); *C09D 183/06* (2013.01); *H01L 51/5253* (2013.01); *C08F 230/08* (2013.01); *C08G 77/20* (2013.01); *H01L 51/5237* (2013.01); *Y02E 10/549* (2013.01)

(58) Field of Classification Search
CPC .......... C08L 83/04; C08L 83/00; C08F 230/08
See application file for complete search history.

(56) References Cited

U.S. PATENT DOCUMENTS

| | | | | |
|---|---|---|---|---|
| 4,303,772 A | * | 12/1981 | Novicky ............... | C08F 230/08 |
| | | | | 526/279 |
| 2007/0298223 A1 | * | 12/2007 | Loch ..................... | C08F 230/06 |
| | | | | 428/172 |
| 2008/0160322 A1 | | 7/2008 | Mochizuki et al. | |
| 2010/0025724 A1 | | 2/2010 | Bae et al. | |
| 2011/0297209 A1 | | 12/2011 | Yamakawa et al. | |
| 2012/0168815 A1 | | 7/2012 | Koh et al. | |
| 2013/0065983 A1 | * | 3/2013 | Ono ....................... | C08L 83/08 |
| | | | | 522/172 |
| 2015/0362628 A1 | * | 12/2015 | Dent ...................... | C08L 83/04 |
| | | | | 252/602 |

FOREIGN PATENT DOCUMENTS

| | | |
|---|---|---|
| JP | 2014-001341 A | 1/2014 |
| JP | 5638714 B2 | 12/2014 |
| JP | 2016-150958 A | 8/2016 |
| KR | 10-2011-0030014 A | 3/2011 |
| KR | 10-2011-0084601 A | 7/2011 |
| KR | 10-2011-0085214 A | 7/2011 |
| KR | 10-2012-0001148 A | 1/2012 |
| KR | 10-2012-0078606 A | 7/2012 |

OTHER PUBLICATIONS

International Search Report for International Patent Application No. PCT/KR2017/010602, dated Jan. 12, 2018, 2 pages.
Australian Office Action, Australian Patent Application No. 2017337720, dated Nov. 7, 2019, 5 pages.

* cited by examiner

*Primary Examiner* — Margaret G Moore
(74) *Attorney, Agent, or Firm* — Nelson Mullins Riley & Scarborough LLP; Kongsik Kim, Esq.

(57) ABSTRACT

The present invention relates to a composition for an organic electronic device encapsulant and an encapsulant formed by using the same. A composition for an encapsulant according to an exemplary embodiment of the present invention includes: 1) a first copolymer including the first unit represented by Chemical Formula 1, the second unit represented by Chemical Formula 2, and the third unit represented by Chemical Formula 3; 2) a second copolymer including the second unit represented by Chemical Formula 2 and the third unit represented by Chemical Formula 3; and 3) one or more photoinitiators.

8 Claims, No Drawings

COMPOSITION FOR ORGANIC ELECTRONIC ELEMENT ENCAPSULANT, AND ENCAPSULANT FORMED USING SAME

CROSS-REFERENCES TO RELATED APPLICATIONS

This application is a U.S. national phase application, pursuant to 35 U.S.C. § 371, of PCT/KR2017/010602, filed Sep. 26, 2017, designating the United States, which claims priority to Korean Application No. 10-2016-0124797, filed Sep. 28, 2016. The entire contents of the aforementioned patent applications are incorporated herein by this reference.

TECHNICAL FIELD

This application claims priority to and the benefit of Korean Patent Application No. 10-2016-0124797 filed in the Korean Intellectual Property Office on Sep. 28, 2016, the entire contents of which are incorporated herein by reference.

The present invention relates to a composition for an organic electronic device encapsulant and an encapsulant formed by using the same.

BACKGROUND ART

In general, organic electronic devices are devices characterized in that a phenomenon such as light emission or a flow of electricity occurs when charges are injected into an organic layer provided between a positive electrode and a negative electrode, and it is possible to manufacture a device which serves various functions according to the organic material selected.

As a representative example, organic light emitting diodes (OLEDs) are thin and light and have excellent color impression and thus have drawn attention in the next-generation flat panel display field, the flexible display field, the lighting field, and the like, and may be manufactured on a glass substrate, an inorganic material substrate including silicon, a metal substrate, and a flexible substrate such as a plastic substrate or a metal foil in the related art. However, these organic electronic devices are extremely vulnerable to moisture and oxygen and thus have a disadvantage in that light emitting efficiency and a service life are significantly reduced when the devices are exposed to the air or when moisture is introduced into the inside of a panel from the outside.

The encapsulation technology is an essential process for preventing oxidation of a light emitting material and an electrode material by blocking moisture and oxygen introduced from the outside of an OLED device, and furthermore, for protecting the device from mechanical and physical impacts applied from the outside of the device.

In order to solve the aforementioned problem, attempts have been made to block moisture and oxygen introduced from the outside by using an encapsulant film using a glass cap or a metal cap or a laminating method or depositing inorganic materials.

However, the glass cap has disadvantages in that coasts are increased by glass processing caused by implementing a large area, and a problem with implementing a large area is caused by mechanical damage, and the like, and also has difficulties in manufacturing a flexible OLED panel which requires flexibility. The metal cap has a problem with a process caused by a difference in thermal expansion coefficient between the metal cap and a substrate. Further, an adhesive film using the laminating method has a problem in that moisture and oxygen are introduced through an interface with an adhesive surface of the film.

Furthermore, when using a metal cap method in which a moisture absorbent is provided inside a panel at the time of encapsulating an organic electronic device, an extension portion which protrudes at a predetermined height is formed in a metal cap structure for using a moisture absorbent, and the metal cap is lastly bonded to a substrate using a bonding agent, or when an organic light emitting device is encapsulated by processing glass to form a glass cap, a method of bonding the glass cap to the substrate by providing a moisture absorbent inside a predetermined groove using a method such as sand blast or etching is used. The method in the related art makes it difficult to process the metal cap due to an expansion of a space inside the encapsulation when a panel becomes large, and may cause a problem in that the glass cap is easily broken by external pressure.

There is a need for developing a new encapsulation technology which is different from the existing encapsulation process due to these difficulties.

SUMMARY

The present invention has been made in an effort to provide a composition capable of preparing an encapsulant which may improve a service life of an organic electronic device and effectively block oxygen or moisture, and the like, which are introduced from the outside, and an encapsulant using the same.

An exemplary embodiment of the present invention provides a composition for an encapsulant, including:

1) a first copolymer including a first unit represented by the following chemical Formula 1, a second unit represented by the following Chemical Formula 2, and a third unit represented by the following Chemical Formula 3;

2) a second copolymer including the second unit represented by the following Chemical Formula 2 and the third unit represented by the following Chemical Formula 3; and 3) one or more photoinitiators.

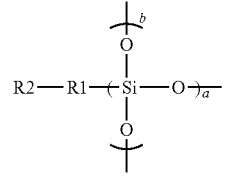

[Chemical Formula 1]

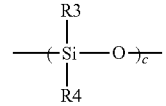

[Chemical Formula 2]

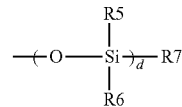

[Chemical Formula 3]

In Chemical Formulae 1 to 3,

R1 is a direct bond, or an alkylene group,

R2 to R7 are the same as or different from each other, and may be each independently selected from the group consisting of hydrogen, an alkyl group, an alkenyl group, an aryl group, a glycidyl group, an isocyanate group, a hydroxy group, a carboxyl group, a vinyl group, an acrylate group, a methacrylate group, an epoxide group, a cyclic ether group, a sulfide group, an acetal group, a lactone group, an amide group, an alkylaryl group, an alkylglycidyl group, an alkylisocyanate group, an alkylhydroxy group, an alkylcarboxyl group, an alkylvinyl group, an alkylacrylate group, an alkylmethacrylate group, an alkyl cyclic ether group, an alkylsulfide group, an alkylacetal group, an alkyl lactone group, and an alkyl amide group, and a, b, c, and d are each independently 1 to 200.

Further, another exemplary embodiment of the present invention provides an encapsulant using the composition for an encapsulant.

In addition, still another exemplary embodiment of the present invention provides an organic electronic device including the encapsulant.

The composition for an encapsulant according to an exemplary embodiment of the present invention is characterized in that it is possible to manufacture an encapsulant which may improve a service life of an organic electronic device and effectively block oxygen and moisture and the like, which are introduced from the outside.

Further, the composition for an encapsulant according to an exemplary embodiment of the present invention has a characteristic of improving the sensitivity of an encapsulant using the composition for an encapsulant by introducing a novel organopolysilicone-based resin such as a first copolymer.

DETAILED DESCRIPTION

Hereinafter, the present application will be described in detail.

Organic EL devices are polycrystalline semiconductor devices, and are used for a liquid crystal backlight, and the like in order to obtain light emission with high brightness at low voltage, and expected as a thin-type flat display device. However, there are problems in that organic EL devices are extremely vulnerable to moisture, an interface between a metal electric field and an organic EL layer may be peeled off due to the effects of moisture, the resistance may be increased due to the oxidation of metal, and organic materials may change in quality by moisture, and as a result, the organic EL devices do not emit light, and brightness may deteriorate.

In order to solve the problems, methods for encapsulating an organic EL device have been developed.

As the existing encapsulation methods, in an organic EL device, there have been usually used a method of melting frit glass between a substrate and an upper glass plate by means of laser and bonding and hermetically sealing the edges of the two substrates, and a system of inserting a moisture absorbent or a filler between a sealed glass plate and an organic EL device to remove moisture thereinside or increase a mechanical strength as a system of bonding the edge between a sealed glass plate and an organic EL substrate by using a sealant.

However, an encapsulation technology using frit glass is a system usually used in a small organic EL device, and a system of bonding the edge of a sealed glass plate by using a sealant has disadvantages in that the strength is reduced and there occurs a warpage phenomenon during a high heat process because there is an empty space between an organic EL device and a glass plate. It is difficult to introduce the encapsulation method into the manufacturing of a flexible organic EL panel, which requires the enlargement and flexibility of the organic EL device.

The present invention has been made in an effort to provide a curable encapsulant composition, which may prepare an encapsulant capable of improving a service life of an organic electronic device and effectively blocking oxygen and moisture, and the like, which are introduced from the outside, and may have process stability when a post-process is performed by introducing a curable system, and an encapsulant using the same.

A composition for an encapsulant according to an exemplary embodiment of the present invention includes: 1) a first copolymer including the first unit represented by Chemical Formula 1, the second unit represented by Chemical Formula 2, and the third unit represented by Chemical Formula 3; 2) a second copolymer including the second unit represented by Chemical Formula 2 and the third unit represented by Chemical Formula 3; and 3) one or more photoinitiators.

In the present invention, the first copolymer is characterized by including: the first unit represented by Chemical Formula 1; the second unit represented by Chemical Formula 2; and the third unit represented by Chemical Formula 3.

In general, a resin in which two oxygen atoms are bonded to one silicone atom in a silicone-based resin refers to a D-type silicone-based resin, and a resin in which three oxygen atoms are bonded to one silicone atom in a silicone-based resin refers to a T-type silicone-based resin. In the related art, the D-type silicone-based resin or the T-type silicone-based resin has been each independently used, or the D-type silicone-based resin and the T-type silicone-based resin have been used in mixtures with each other. However, a silicone-based resin such as the first copolymer according to the present invention is not a mixture of the D-type silicone-based resin and the T-type silicone-based resin as in the related art, but a silicone-based resin which includes both D-type and T-type in the silicone-based resin and is different from that in the related art.

An exemplary embodiment of the present invention has characteristics that a suitable strength of an encapsulant thin film may be obtained and the sensitivity may be improved during a curing process of an encapsulant composition, by including both D-type and T-type in a silicone resin.

In an exemplary embodiment of the present invention, R2 of Chemical Formula 1 may be a vinyl group, an acrylate group or a methacrylate group, but is not limited thereto. In an exemplary embodiment of the present invention, R3 to R7 of Chemical Formulae 2 and 3 may be each independently hydrogen or an alkyl group, but are not limited thereto.

In the first copolymer, a weight ratio of the first unit represented by Chemical Formula 1: the second represented by Chemical Formula 2: the third unit represented by Chemical Formula 3 may be (1 to 30): (5 to 80): (1 to 30) and (5 to 15): (10 to 50): (5 to 15), but is not limited thereto.

The first copolymer may have a weight average molecular weight of 100 to 1,000,000 and 1,000 to 50,000, but the weight average molecular weight is not limited thereto.

The content of the first copolymer may be 20 to 90 wt % and 30 to 70 wt % based on a total weight of the composition for an encapsulant, but is not limited thereto.

In the present invention, the second copolymer is characterized by including the second unit represented by Chemical Formula 2 and the third unit represented by Chemical Formula 3. The second copolymer may be a D-type silicone-based resin.

In the second copolymer, a weight ratio of the second unit represented by Chemical Formula 2: the third unit represented by Chemical Formula 3 may be 1:1 to 100:1, 1:1 to 10:1, and 3:1 to 7:1, but is not limited thereto.

The second copolymer may have a weight average molecular weight of 100 to 1,000,000 and 1,000 to 50,000, but the weight average molecular weight is not limited thereto.

The content of the second copolymer may be 1 to 70 wt % and 5 to 60 wt % based on the total weight of the composition for an encapsulant, but is not limited thereto.

An exemplary embodiment of the present invention has characteristics that a suitable strength of an encapsulant thin film may be obtained and the sensitivity may be improved during a curing process of an encapsulant composition, by applying both the first copolymer and the second copolymer.

In the present invention, the first copolymer and the second copolymer may be each independently a random copolymer.

In the present invention, the photoinitiator is thermally inactive, but generates free radicals when exposed to chemical rays. Examples of the photoinitiator include a substituted or unsubstituted polynuclear quinone, which is a compound having two intra-cyclic carbon atoms among the conjugated carbon cyclic compounds, for example, 2-benzyl-2-(dimethylamino)-1-(4-morpholino phenyl)-1-butanone, 2,2-dimethoxy-2-phenylacetophenone, 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz(benza)anthracene-7,12-dione, 2,3-naphthacene-5,12-dione, 2-methyl-1,4-naphthoquinone, 1,4-dimethyl anthraquinone, 2,3-dimethyl anthraquinone, 2-phenyl anthraquinone, 2,3-diphenyl anthraquinone, retenquinone, 7,8,9,10-tetrahydronaphthracene-5,12-dione, and 1,2,3,4-tetrahydrobenz(tetrahydrobenza)-anthracene-7,12-dione, but are not limited thereto.

The content of the photoinitiator may be 0.1 to 10 wt % based on the total weight of the composition for an encapsulant, but is not limited thereto. When the content of the photoinitiator is less than 0.1 wt % based on the total weight of the composition for an encapsulant, there may occur a problem in that even though strong ultraviolet rays are irradiated thereon, curing does not proceed due to a small number of active radicals which promotes the curing, and when the content exceeds 10 wt %, there is concern in that a service life of an organic light emitting device may be shortened because outgassing occurs under the temperature conditions of less than 100° C. after the curing.

In an exemplary embodiment of the present invention, the composition for an encapsulant may additionally include a reactive silicone-based oligomer represented by the following Chemical Formula 4.

[Chemical Formula 4]

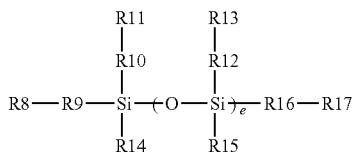

In Chemical Formula 4,

R9, R10, R12, and R16 are the same as or different from each other, and are each independently a direct bond or an alkylene group, R8, R11, R13, R14, R15, and R17 are the same as or different from each other, and may be each independently selected from the group consisting of hydrogen, an alkyl group, an alkenyl group, an aryl group, a glycidyl group, an isocyanate group, a hydroxy group, a carboxyl group, a vinyl group, an acrylate group, a methacrylate group, an epoxide group, a cyclic ether group, a sulfide group, an acetal group, a lactone group, an amide group, an alkylaryl group, an alkylglycidyl group, an alkylisocyanate group, an alkylhydroxy group, an alkylcarboxyl group, an alkylvinyl group, an alkylacrylate group, an alkylmethacrylate group, an alkyl cyclic ether group, an alkylsulfide group, an alkylacetal group, an alkyl lactone group, and an alkyl amide group, and e is 1 to 100.

In an exemplary embodiment of the present invention, the reactive silicone-based oligomer may have a weight average molecular weight of 100 to 15,000, but the weight average molecular weight is not limited thereto.

In an exemplary embodiment of the present invention, R11 and R13 of Chemical Formula 4 may be each independently a vinyl group, an acrylate group or a methacrylate group, but are not limited thereto.

In an exemplary embodiment of the present invention, R8, R14, R15, and R17 of Chemical Formula 4 may be each independently hydrogen or an alkyl group, but are not limited thereto.

In an exemplary embodiment of the present invention, Chemical Formula 4 may be represented by the following Chemical Formula 5.

[Chemical Formula 5]

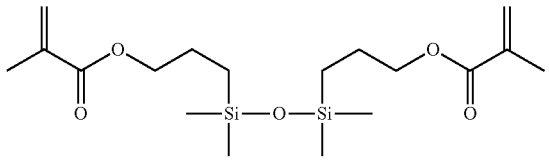

In an exemplary embodiment of the present invention, the reactive silicone-based oligomer may serve to adjust the surface leveling of an encapsulant of a composition for an encapsulant.

In an exemplary embodiment of the present invention, the composition for an encapsulant may include a first copolymer, a second copolymer, a photoinitiator, and a reactive silicone-based oligomer. At this time, based on the total weight of the composition for an encapsulant, the content of the first copolymer may be 20 to 60 wt %, the content of the second copolymer may be 10 to 30 wt %, the content of the photoinitiator may be 0.1 to 10 wt %, and the content of the reactive silicone-based oligomer may be 20 to 60 wt %, but the contents are not limited thereto.

The composition for an encapsulant according to an exemplary embodiment of the present invention may additionally include a monomer known in the art in order to adjust a curing speed of the silicone resin material. Specific examples of the monomer include an acrylate-based monomer, a methacrylate-based monomer, a siloxane-based monomer, and the like, but are not limited thereto.

Examples of the monomer include triethylolpropane ethoxy triacrylate, t-butyl (meth)acrylate, 1,5-pentanediol di(meth)acrylate, N,N-diethylaminoethyl (meth)acrylate, ethylene glycol di(meth)acrylate, 1,4-butanediol di(meth) acrylate, diethylene glycol di(meth)acrylate, hexamethylene glycol di(meth)acrylate, 1,3-propanediol di(meth)acrylate, decamethylene glycol di(meth)acrylate, 1,4-cyclohexanediol di(meth)acrylate, 2,2-dimethylolpropane di(meth)acrylate, glycerol di(meth)acrylate, tripropylene glycol di(meth) acrylate, glycerol tri(meth)acrylate, trimethylolpropane tri (meth)acrylate, pentaerythritol tri(meth)acrylate, polyoxyethylated trimethylolpropane tri(meth)acrylate, 2,2-di-(p-hydroxyphenyl)propane diacrylate, pentaerythritol tetra(meth)acrylatelate, 2,2-di-(p-hydroxyphenyl)propane dimethacrylate, triethylene glycol diacrylate, polyoxyethyl-2,2-di-(p-hydroxyphenyl)propane dimethacrylate, di-(3-methacryloxy-3-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol di(meth)acrylate, 1,2,4-butanetriol tri(meth)acrylate, 2,2,4-trimethyl-1,3-pentanediol di(meth)acrylate, 1-phenylethylene-1,2-dimethacrylate, diallyl fumarate, styrene, 1,4-benzenediol dimethacrylate, 1,4-diisopropenyl benzene, 1,3, 5-triisopropenyl benzene, a silicone-based monomer, a silicone acrylate-based monomer, a silicone urethane-based monomer, and the like, but are not limited thereto.

In addition, the composition for an encapsulant according to an exemplary embodiment of the present application may include one or more additives such as a curing catalyst, a viscosity adjusting agent, a curing agent, a dispersing agent, a stabilizer, and a curing promoter depending on the use thereof. These additives may be used either alone or in mixture of two or more thereof.

Furthermore, an encapsulant according to an exemplary embodiment of the present invention is characterized by using the composition for an encapsulant. More specifically, the encapsulant according to an exemplary embodiment of the present invention may include: 1) a first copolymer including the first unit represented by Chemical Formula 1, the second unit represented by Chemical Formula 2, and the third unit represented by Chemical Formula 3; 2) a second copolymer including the second unit represented by Chemical Formula 2 and the third unit represented by Chemical Formula 3; and 3) one or more photoinitiators. Further, the encapsulant according to an exemplary embodiment of the present invention may additionally include the reactive silicone-based oligomer represented by Chemical Formula 4.

In the encapsulant according to an exemplary embodiment of the present invention, the contents on the first copolymer, the second copolymer, the photoinitiator, the reactive silicone-based oligomer, and the like are the same as those described above, and thus the specific description thereof will be omitted.

The encapsulant according to an exemplary embodiment of the present invention may be formed by using a method known in the art, except that the above-described composition for an encapsulant is used. More specifically, the encapsulant may be formed by using a method of applying, coating, or printing the composition for an encapsulant on a substrate, but the method is not limited thereto.

The composition for an encapsulant according to an exemplary embodiment of the present invention is characterized in that it is possible to manufacture an encapsulant which may improve a service life of an organic electronic device and effectively block oxygen and moisture and the like, which are introduced from the outside. In addition, the composition for an encapsulant according to an exemplary embodiment of the present invention has characteristics that by including both D-type and T-type silicone resins in a first copolymer, it is possible to obtain high sensitivity even at low energy particularly during UV curing, and a cured product having both flexibility and strength is obtained, and simultaneously, effects of outgases on a device are minimized.

The encapsulant according to an exemplary embodiment of the present invention may be applied to those which encapsulate and protect various objects. In particular, the encapsulant may be effective for protecting an object including a device which is sensitive to an external component, for example, moisture and humidity. Examples of the object to which the encapsulant may be applied include: a photovoltaic device, a rectifier, a transmitter, or an organic electronic device such as an organic light emitting diode (OLED); a solar cell; or a secondary battery, and the like, but are not limited thereto.

For an object to which the encapsulant according to an exemplary embodiment of the present invention is applied, an inorganic protective layer and the encapsulant of the present invention may be multi-layered to seal the device. The inorganic protective layer and the encapsulant of the present invention may be alternately stacked, but the stacking is not limited thereto. The inorganic protective layer means an inorganic protective layer deposited by a vacuum process such as sputtering, evaporation, sublimation, chemical vapor deposition, metal organic chemical vapor deposition, and a combination thereof.

Furthermore, the encapsulant reduces the possibility that the encapsulant remains inside a sealed structure by minimizing out gases resulting from byproducts produced in a curing process or unreacted residues in a curing initiator, and exhibits excellent transparency, and as a result, the encapsulant may be formed as a stable encapsulant regardless of the type of organic electronic device such as top emission or bottom emission.

The organic electronic device may be provided with a typical configuration known in the art, except that an encapsulant is formed of the above-described materials. For example, it is possible to use glass, metal or a polymer film, and the like, which are typically used in the art, as a lower or upper substrate. Furthermore, the organic electronic device may include, for example, a pair of electrodes and a layer of an organic material formed between the pair of electrodes. Here, one of the pair of electrodes may be formed of a transparent electrode. Further, the layer of the organic material may include, for example, a hole transporting layer, a light emitting layer, an electron transporting layer, and the like.

MODE FOR INVENTION

Hereinafter, the present specification will be described in more detail through Examples. However, the following Examples are provided only for exemplifying the present specification, but are not intended to limit the present specification.

EXAMPLES

Synthesis Example 1

500 g of TSL8370 (manufactured by Momentive Inc.), 1,000 g of TSL8032 (manufactured by Momentive Inc.), 130 g of TSL8031 (manufactured by Momentive Inc.), and 1,600 g of toluene were put into and stirred well in a 5,000 ml three-necked round flask, and then 100 g of water was added dropwise thereto at room temperature, and the resulting mixture was stirred for about 1 hour.

After the stirring, 700 g of water was additionally added thereto, and then the temperature was increased to 70° C., and the resulting mixture was stirred for 2 hours. After the stirring was completed, the silicone layer and the aqueous layer were separated, the aqueous layer was discarded, and the silicone polymer layer was left behind.

The silicone polymer layer was heated to 80° C., and then 0.5 g of a KOH solution diluted to 50% was put thereinto, and the resulting mixture was warmed to 120° C. and stirred for 2 hours. Water was completely removed from the final silicone polymer layer, thereby obtaining a first copolymer A.

As a result of measuring the molecular weight by GPC, a weight average molecular weight of 2,000 g/mol was measured by polystyrene standard.

Synthesis Example 2

150 g of TSL8370 (manufactured by Momentive Inc.), 1,250 g of TSL8032 (manufactured by Momentive Inc.), 65 g of TSL8031 (manufactured by Momentive Inc.), and 1,600 g of toluene were put into and stirred well in a 5,000 ml three-necked round flask, and then 100 g of water was added dropwise thereto at room temperature, and the resulting mixture was stirred for about 1 hour.

After the stirring, 700 g of water was additionally added thereto, and then the temperature was increased to 70° C., and the resulting mixture was stirred for 2 hours. After the stirring was completed, the silicone layer and the aqueous layer were separated, the aqueous layer was discarded, and the silicone polymer layer was left behind.

The silicone polymer layer was heated to 80° C., and then 0.5 g of a KOH solution diluted to 50% was put thereinto, and the resulting mixture was warmed to 120° C. and stirred for 2 hours. Water was completely removed from the final silicone polymer layer, thereby obtaining a first copolymer B.

As a result of measuring the molecular weight by GPC, a weight average molecular weight of 5,000 g/mol was measured by polystyrene standard.

Synthesis Example 3

500 g of TSL8370 (manufactured by Momentive Inc.), 625 g of TSL8032 (manufactured by Momentive Inc.), 320 g of TSL8031 (manufactured by Momentive Inc.), and 1,600 g of toluene were put into and stirred well in a 5,000 ml three-necked round flask, and then 100 g of water was added dropwise thereto at room temperature, and the resulting mixture was stirred for about 1 hour.

After the stirring, 700 g of water was additionally added thereto, and then the temperature was increased to 70° C., and the resulting mixture was stirred for 2 hours. After the stirring was completed, the silicone layer and the aqueous layer were separated, the aqueous layer was discarded, and the silicone polymer layer was left behind.

The silicone polymer layer was heated to 80° C., and then 0.5 g of a KOH solution diluted to 50% was put thereinto, and the resulting mixture was warmed to 120° C. and stirred for 2 hours. Water was completely removed from the final silicone polymer layer, thereby obtaining a first copolymer C.

As a result of measuring the molecular weight by GPC, a weight average molecular weight of 11,000 g/mol was measured by polystyrene standard.

Synthesis Example 4

500 g of TSL8370 (manufactured by Momentive Inc.), 700 g of TSL8032 (manufactured by Momentive Inc.), 215 g of TSL8031 (manufactured by Momentive Inc.), and 1,600 g of toluene were put into and stirred well in a 5,000 ml three-necked round flask, and then 100 g of water was added dropwise thereto at room temperature, and the resulting mixture was stirred for about 1 hour.

After the stirring, 700 g of water was additionally added thereto, and then the temperature was increased to 70° C., and the resulting mixture was stirred for 2 hours. After the stirring was completed, the silicone layer and the aqueous layer were separated, the aqueous layer was discarded, and the silicone polymer layer was left behind.

The silicone polymer layer was heated to 80° C., and then 0.5 g of a KOH solution diluted to 50% was put thereinto, and the resulting mixture was warmed to 120° C. and stirred for 2 hours. Water was completely removed from the final silicone polymer layer, thereby obtaining a first copolymer D.

As a result of measuring the molecular weight by GPC, a weight average molecular weight of 14,600 g/mol was measured by polystyrene standard.

Synthesis Example 5

450 g of TSL8032 (manufactured by Momentive Inc.), 100 g of TSL8031 (manufactured by Momentive Inc.), and 1,200 g of toluene were put into and stirred well in a 5,000 ml three-necked round flask, and then 120 g of water was added dropwise thereto at room temperature, and the resulting mixture was stirred for about 1 hour.

After the stirring, 700 g of water was additionally added thereto, and then the temperature was increased to 70° C., and the resulting mixture was stirred for 2 hours. After the stirring was completed, the silicone layer and the aqueous layer were separated, the aqueous layer was discarded, and the silicone polymer layer was left behind.

The silicone polymer layer was heated to 80° C., and then 0.5 g of a KOH solution diluted to 50% was put thereinto, the resulting mixture was warmed to 120° C. and stirred for 2 hours, and then a final product was obtained.

Water was completely removed from the silicone polymer layer, thereby obtaining a second copolymer A.

As a result of measuring the molecular weight by GPC, a weight average molecular weight of 1,600 g/mol was measured by polystyrene standard.

Synthesis Example 6

720 g of TSL8032 (manufactured by Momentive Inc.), 20 g of TSL8031 (manufactured by Momentive Inc.), and 1,200 g of toluene were put into and stirred well in a 5,000 ml three-necked round flask, and then 120 g of water was added dropwise thereto at room temperature, and the resulting mixture was stirred for about 1 hour.

After the stirring, 700 g of water was additionally added thereto, and then the temperature was increased to 70° C., and the resulting mixture was stirred for 2 hours. After the stirring was completed, the silicone layer and the aqueous layer were separated, the aqueous layer was discarded, and the silicone polymer layer was left behind.

The silicone polymer layer was heated to 80° C., and then 0.5 g of a KOH solution diluted to 50% was put thereinto, the resulting mixture was warmed to 120° C. and stirred for 2 hours, and then a final product was obtained.

Water was completely removed from the silicone polymer layer, thereby obtaining a second copolymer B.

As a result of measuring the molecular weight by GPC, a weight average molecular weight of 8,500 g/mol was measured by polystyrene standard.

Example 1

48 g of the first copolymer A obtained in Synthesis Example 1, 48 g of the second copolymer A obtained in Synthesis Example 5, and 4 g of a photoinitiator (TPO-L) manufactured by BASF AG were stirred well in a glass vial, thereby obtaining a silicone photosensitive resin composition.

Example 2

48 g of the first copolymer A obtained in Synthesis Example 1, 48 g of the second copolymer B obtained in Synthesis Example 6, and 4 g of a photoinitiator (TPO-L) manufactured by BASF AG were stirred well in a glass vial, thereby obtaining a silicone photosensitive resin composition.

Example 3

48 g of the first copolymer B obtained in Synthesis Example 2, 48 g of the second copolymer A obtained in Synthesis Example 5, and 4 g of a photoinitiator (TPO-L) manufactured by BASF AG were stirred well in a glass vial, thereby obtaining a silicone photosensitive resin composition.

Example 4

48 g of the first copolymer B obtained in Synthesis Example 2, 48 g of the second copolymer B obtained in Synthesis Example 6, and 4 g of a photoinitiator (TPO-L) manufactured by BASF AG were stirred well in a glass vial, thereby obtaining a silicone photosensitive resin composition.

Example 5

48 g of the first copolymer C obtained in Synthesis Example 3, 48 g of the second copolymer A obtained in Synthesis Example 5, and 4 g of a photoinitiator (TPO-L) manufactured by BASF AG were stirred well in a glass vial, thereby obtaining a silicone photosensitive resin composition.

Example 6

48 g of the first copolymer C obtained in Synthesis Example 3, 48 g of the second copolymer B obtained in Synthesis Example 6, and 4 g of a photoinitiator (TPO-L) manufactured by BASF AG were stirred well in a glass vial, thereby obtaining a silicone photosensitive resin composition.

Example 7

48 g of the first copolymer D obtained in Synthesis Example 4, 48 g of the second copolymer A obtained in Synthesis Example 5, and 4 g of a photoinitiator (TPO-L) manufactured by BASF AG were stirred well in a glass vial, thereby obtaining a silicone photosensitive resin composition.

Example 8

48 g of the first copolymer D obtained in Synthesis Example 4, 48 g of the second copolymer B obtained in Synthesis Example 6, and 4 g of a photoinitiator (TPO-L) manufactured by BASF AG were stirred well in a glass vial, thereby obtaining a silicone photosensitive resin composition.

Example 9

38.4 g of the first copolymer A obtained in Synthesis Example 1, 19.2 g of the second copolymer A obtained in Synthesis Example 5, 38.4 g of a silicone-based oligomer having the structure of Chemical Formula 5 (TSL9706 manufactured by Momentive Inc.), and 4 g of a photoinitiator (TPO-L) manufactured by BASF AG were stirred well in a glass vial, thereby obtaining a silicone photosensitive resin composition.

Example 10

38.4 g of the first copolymer obtained in Synthesis Example 1, 19.2 g of the second copolymer B obtained in Synthesis Example 6, 38.4 g of a silicone-based oligomer having the structure of Chemical Formula 5 (TSL9706 manufactured by Momentive Inc.), and 4 g of a photoinitiator (TPO-L) manufactured by BASF AG were stirred well in a glass vial, thereby obtaining a silicone photosensitive resin composition.

Example 11

38.4 g of the first copolymer D obtained in Synthesis Example 4, 19.2 g of the second copolymer A obtained in Synthesis Example 5, 38.4 g of a silicone-based oligomer having the structure of Chemical Formula 5 (TSL9706 manufactured by Momentive Inc.), and 4 g of a photoinitiator (TPO-L) manufactured by BASF AG were stirred well in a glass vial, thereby obtaining a silicone photosensitive resin composition.

Example 12

38.4 g of the first copolymer D obtained in Synthesis Example 4, 19.2 g of the second copolymer B obtained in Synthesis Example 6, 38.4 g of a silicone-based oligomer having the structure of Chemical Formula 5 (TSL9706 manufactured by Momentive Inc.), and 4 g of a photoinitiator (TPO-L) manufactured by BASF AG were stirred well in a glass vial, thereby obtaining a silicone photosensitive resin composition.

Comparative Example 1

96 g of the second copolymer A obtained in Synthesis Example 5 and 4 g of a photoinitiator (TPO-L) manufactured by BASF AG were stirred well in a glass vial, thereby obtaining a silicone photosensitive resin composition.

Comparative Example 2

96 g of the second copolymer B obtained in Synthesis Example 6 and 4 g of a photoinitiator (TPO-L) manufactured by BASF AG were stirred well in a glass vial, thereby obtaining a silicone photosensitive resin composition.

Comparative Example 3

48 g of the second copolymer A obtained in Synthesis Example 5, 48 g of a silicone-based oligomer having the structure of Chemical Formula 5 (TSL9706 manufactured by Momentive Inc.), and 4 g of a photoinitiator (TPO-L) manufactured by BASF AG were stirred well in a glass vial, thereby obtaining a silicone photosensitive resin composition.

Comparative Example 4

48 g of the second copolymer B obtained in Synthesis Example 6, 48 g of a silicone-based oligomer having the structure of Chemical Formula 5 (TSL9706 manufactured by Momentive Inc.), and 4 g of a photoinitiator (TPO-L) manufactured by BASF AG were stirred well in a glass vial, thereby obtaining a silicone photosensitive resin composition.

Comparative Example 5

96 g of a silicone-based oligomer having the structure of Chemical Formula 5 (TSL9706 manufactured by Momentive Inc.) and 4 g of a photoinitiator (TPO-L) manufactured by BASF AG were stirred well in a glass vial, thereby obtaining a silicone photosensitive resin composition.

TABLE 1

| | Constituent component (wt %) | | | |
|---|---|---|---|---|
| | First copolymer | Second copolymer | Silicone-based oligomer | Photoinitiator |
| Example 1 | First copolymer A 48 wt % | Second copolymer A 48 wt % | — | 4 wt % |
| Example 2 | First copolymer A 48 wt % | Second copolymer B 48 wt % | — | 4 wt % |
| Example 3 | First copolymer B 48 wt % | Second copolymer A 48 wt % | — | 4 wt % |
| Example 4 | First copolymer B 48 wt % | Second copolymer B 48 wt % | — | 4 wt % |
| Example 5 | First copolymer C 48 wt % | Second copolymer A 48 wt % | — | 4 wt % |
| Example 6 | First copolymer C 48 wt % | Second copolymer B 48 wt % | — | 4 wt % |
| Example 7 | First copolymer D 48 wt % | Second copolymer A 48 wt % | — | 4 wt % |
| Example 8 | First copolymer D 48 wt % | Second copolymer B 48 wt % | — | 4 wt % |
| Example 9 | First copolymer A 38.4 wt % | Second copolymer A 19.2 wt % | 38.4 wt % | 4 wt % |
| Example 10 | First copolymer A 38.4 wt % | Second copolymer B 19.2 wt % | 38.4 wt % | 4 wt % |
| Example 11 | First copolymer D 38.4 wt % | Second copolymer A 19.2 wt % | 38.4 wt % | 4 wt % |
| Example 12 | First copolymer D 38.4 wt % | Second copolymer B 19.2 wt % | 38.4 wt % | 4 wt % |
| Comparative Example 1 | — | Second copolymer A 96 wt % | — | 4 wt % |
| Comparative Example 2 | — | Second copolymer B 96 wt % | — | 4 wt % |
| Comparative Example 3 | — | Second copolymer A 48 wt % | 48 wt % | 4 wt % |
| Comparative Example 4 | — | Second copolymer B 48 wt % | 48 wt % | 4 wt % |
| Comparative Example 5 | — | — | 96 wt % | 4 wt % |

Characteristics of the compositions prepared in Examples 1 to 12 and Comparative Examples 1 to 5 were evaluated, and the evaluation results are shown in the following Table 2.

TABLE 2

| | Adhesion test after curing | Photocuring rate (UV curing conversion) | Weight loss of thin film after curing (%) | Pencil hardness |
|---|---|---|---|---|
| Example 1 | Cured | 93% | 0.3% | 5 H |
| Example 2 | Cured | 92.7% | 0.45% | 5 H |
| Example 3 | Cured | 93.2% | 0.33% | 5 H |
| Example 4 | Cured | 94% | 0.32% | 5 H |
| Example 5 | Cured | 93.5% | 0.45% | 5 H |
| Example 6 | Cured | 95% | 0.2% | 5 H |
| Example 7 | Cured | 97.2% | 0.17% | 5 H |
| Example 8 | Cured | 96.8% | 0.15% | 5 H |
| Example 9 | Cured | 92.3% | 0.43% | 5 H |
| Example 10 | Cured | 92% | 0.46% | 5 H |
| Example 11 | Cured | 94.2% | 0.35% | 5 H |
| Example 12 | Cured | 93.1% | 0.3% | 5 H |
| Comparative Example 1 | Uncured | 22% | 13.5% | <5 B |
| Comparative Example 2 | Uncured | 17% | 11.4% | <5 B |
| Comparative Example 3 | Cured | 57.3% | 7.5% | 1 B |
| Comparative Example 4 | Cured | 61% | 6.3% | 1 B |
| Comparative Example 5 | Cured | 68% | 6.7% | 1 B |

Experimental Example

1) Adhesion Test after Curing

A silicone photosensitive resin composition of the present invention was applied to have a suitable thickness, for example, a thickness of 4 to 40 μm on a substrate subjected to a predetermined pre-treatment by using a method such as a spin or coating method, a roll coating method, a screen printing method, and an applicator method, and then the applied surface was covered with the same substrate. And then, the substrate was irradiated with the energy of 1 J at an i-line wavelength of 395 nm. As a light source used for the irradiation, a low-pressure mercury lamp, a high-pressure mercury lamp, a super high-pressure mercury lamp, a metal halide lamp, an argon gas laser, and the like may be used, and in some cases, an X-ray, an electron ray, and the like may also be used.

Whether the composition was cured or uncured was determined according to whether the substrate was pushed out when pushing the upper substrate by applying a certain force after the substrate was irradiated with the energy. When the upper substrate was pushed out and thus separated from the lower substrate, it was determined that the composition was uncured, and when the upper substrate was firmly fixed and was not pushed out, it was determined that the composition was cured.)

2) Photocuring Rate (UV Curing Conversion %)

The photocuring rate was confirmed by using FT-IR (IR-Prestige21, manufactured by Shimadzu Corp.). A thin film was applied to have a thickness of 5 μm onto a film which does not absorb light at all and has a transmittance of 100%, and then the surface thereof was covered with the same film. A sample thus obtained was subjected to FT-IR analysis before the sample was cured and after the sample was irradiated with 1 J (@395 nm LED wavelength) and with 5 J (@395 nm LED wavelength) to measure the transmittance (%) intensity of the transmission peak around 1,635 cm$^{-1}$ (C=C). The photocuring rate was calculated according to the following Equation 1.

[(B−A)/(C−A)]×100　　　[Equation 1]

In Equation 1,

A is a transmittance (%) around 1,635 cm$^{-1}$ (C=C) before the curing, B is a transmittance (%) around 1,635 cm$^{-1}$ (C=C) after the curing at 1 J, and C is a transmittance (%) around 1,635 cm$^{-1}$ (C=C) after the curing at 5 J.

When the photocuring rate is low, a large amount of uncured residue is produced, leading to an increase in TGA weight loss %, which is responsible for generating a large amount of out gas of the coating film.

3) Weight Loss of Thin Film After Curing

A thin film was applied to have a thickness of 5 μm onto a film which does not absorb light at all and has a transmittance of 100%, and then the surface thereof was covered with the same film. A sample thus obtained was irradiated with energy of 1 J (@395 nm LED wavelength), the film was removed, and then a cured film was obtained. For the cured film, the heat resistance was evaluated as follows through TGA (Thermo-Gravimetric Analysis, Q50, TA Corp.).

The measurement conditions were as follows: The cured film was warmed from 30° C. to 120° C. at a speed of 10° C. per minute and was heated isothermally at 120° C. for 5 minutes to remove moisture, and then the temperature was lowered to 30° C. The cured film was warmed to 100° C. by using the Jump method and was heated isothermally at 100° C. for 60 minutes. The measurement temperature was lowered to 30° C., and then the weight of cured film lost was analyzed as % through isothermal heating. The smaller the loss amount is, the better the heat resistance is.

4) Pencil Hardness

The composition was applied to form a thin film having a thickness of 5 μm, and was UV-cured under a nitrogen atmosphere. The exposure energy was 395 nm 1 J. The surface hardness of the present cured film was measured in accordance with the method described in ASTM-D3363. In a pencil hardness tester, after a Mitsubishi pencil was brought into contact with the substrate, in a state where the load was increased by placing a 500 g weight scale thereon, the surface of the substrate was scratched at a speed of 50 mm/sec and observed, and the hardness was measured. The measurement criteria were evaluated in accordance with the criteria when the shape of abrasion, peel-off, tear, and scratch of the surface was not observed at a level corresponding to the pencil hardness.

As described above, the composition for an encapsulant according to an exemplary embodiment of the present invention is characterized in that it is possible to prepare an encapsulant which may improve a service life of an organic electronic device, and effectively block oxygen and moisture and the like, which are introduced from the outside.

Further, the composition for an encapsulant according to an exemplary embodiment of the present invention has a characteristic of improving the sensitivity of an encapsulant using the composition for an encapsulant by introducing a novel organopolysilicone-based resin such as a first copolymer.

The invention claimed is:

1. A composition for an encapsulant, comprising:
a first copolymer comprising a first unit represented by the following Chemical Formula 1, a second unit represented by the following Chemical Formula 2, and a third unit represented by the following Chemical Formula 3;
a second copolymer comprising the second unit represented by the following Chemical Formula 2 and the third unit represented by the following Chemical Formula 3;
one or more photoinitiators; and
a reactive silicone-based oligomer represented by the following Chemical Formula 5:

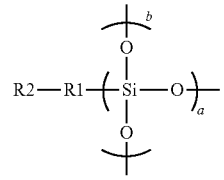

[Chemical Formula 1]

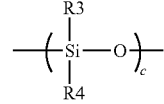

[Chemical Formula 2]

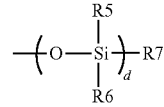

[Chemical Formula 3]

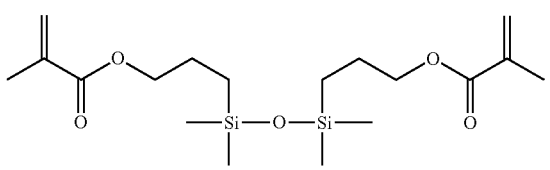

[Chemical Formula 5]

in Chemical Formulae 1 to 3,

R1 is a direct bond, or an alkylene group,

R2 to R7 are the same as or different from each other, and are each independently selected from the group consisting of hydrogen, an alkyl group, an alkenyl group, an aryl group, a glycidyl group, an isocyanate group, a hydroxy group, a carboxyl group, a vinyl group, an acrylate group, a methacrylate group, an epoxide group, a cyclic ether group, a sulfide group, an acetal group, a lactone group, an amide group, an alkylaryl group, an alkylglycidyl group, an alkylisocyanate group, an alkylhydroxy group, an alkylcarboxyl group, an alkylvinyl group, an alkylacrylate group, an alkylmethacrylate group, an alkyl cyclic ether group, an alkylsulfide group, an alkylacetal group, an alkyl lactone group, and an alkyl amide group, and a, b, c, and d are each independently 1 to 200.

2. The composition of claim 1, wherein R2 of Chemical Formula 1 is a vinyl group, an acrylate group, or a methacrylate group.

3. The composition of claim 1, wherein R3 to R7 of Chemical Formulae 2 and 3 are each independently hydrogen or an alkyl group.

4. The composition of claim 1, wherein in the first copolymer, a weight ratio of the first unit represented by Chemical Formula 1: the second unit represented by Chemical Formula 2: the third unit represented by Chemical Formula 3 is (1 to 30): (5 to 80): (1 to 30).

5. The composition of claim 1, wherein in the second copolymer, a weight ratio of the second unit represented by Chemical Formula 2: the third unit represented by Chemical Formula 3 is 1:1 to 100:1.

6. The composition of claim 1, wherein based on the total weight of the composition for an encapsulant, the content of the first copolymer is 20 to 60 wt %, the content of the second copolymer is 10 to 30 wt %, the content of the photoinitiator is 0.1 to 10 wt %, and the content of the reactive silicone-based oligomer is 20 to 60 wt %.

7. An encapsulant formed by using the composition for an encapsulant according to claim 1.

8. An organic electronic device comprising the encapsulant according to claim 7.

* * * * *